(12) United States Patent
Vilas Boas

(10) Patent No.: US 7,649,348 B2
(45) Date of Patent: Jan. 19, 2010

(54) AUXILIARY ELEMENT FOR FIXING A CURRENT SENSOR TO AN ELECTRICAL CONDUCTOR

(75) Inventor: Armando Vilas Boas, Saint Priest (FR)

(73) Assignee: ABB Entrelec, Villeurbanne (FR)

( * ) Notice: Subject to any disclaimer, the term of this patent is extended or adjusted under 35 U.S.C. 154(b) by 754 days.

(21) Appl. No.: 10/580,913

(22) PCT Filed: Nov. 24, 2004

(86) PCT No.: PCT/FR2004/002997

§ 371 (c)(1),
(2), (4) Date: Jun. 30, 2006

(87) PCT Pub. No.: WO2005/066641

PCT Pub. Date: Jul. 21, 2005

(65) Prior Publication Data

US 2007/0046280 A1 Mar. 1, 2007

(30) Foreign Application Priority Data

Dec. 5, 2003 (FR) .................................. 03 14298

(51) Int. Cl.
*G01R 1/20* (2006.01)
(52) U.S. Cl. ....................... 324/126; 324/156
(58) Field of Classification Search ....................... None
See application file for complete search history.

(56) References Cited

U.S. PATENT DOCUMENTS

| 4,258,348 | A | | 3/1981 | Belfer et al. |
| 4,386,752 | A | | 6/1983 | Pavlak et al. |
| 5,426,360 | A | * | 6/1995 | Maraio et al. ............... 324/126 |
| 5,675,128 | A | | 10/1997 | Simon et al. |
| 6,963,197 | B1 | * | 11/2005 | Feight et al. ................ 324/126 |

FOREIGN PATENT DOCUMENTS

| FR | 2 793 884 | 11/2000 |
| JP | 56-142614 | 11/1981 |
| JP | 2-180010 | 7/1990 |

* cited by examiner

*Primary Examiner*—Vinh P Nguyen
(74) *Attorney, Agent, or Firm*—Young & Thompson

(57) ABSTRACT

An auxiliary element includes an end plate having an inner face which is intended to be applied against a large surface of a sensor and an outer face which bears two spaced-apart mounting lugs on a first edge thereof, the lugs extending outwards perpendicularly to the outer face. A first pair of passages is formed in the lugs for first screws used to fix the auxiliary element to a support. In addition, the end plate includes a through opening for the electrical conductor and a second pair of passages, symmetrically on either side of the opening, for second screws used to fix the end plate to the sensor. The through opening is formed by a recess provided on a second edge, opposite the first edge, and the second pair of passages are formed by two parallel slits which extend perpendicularly to the first edge of the end plate.

11 Claims, 3 Drawing Sheets

Figure 1:
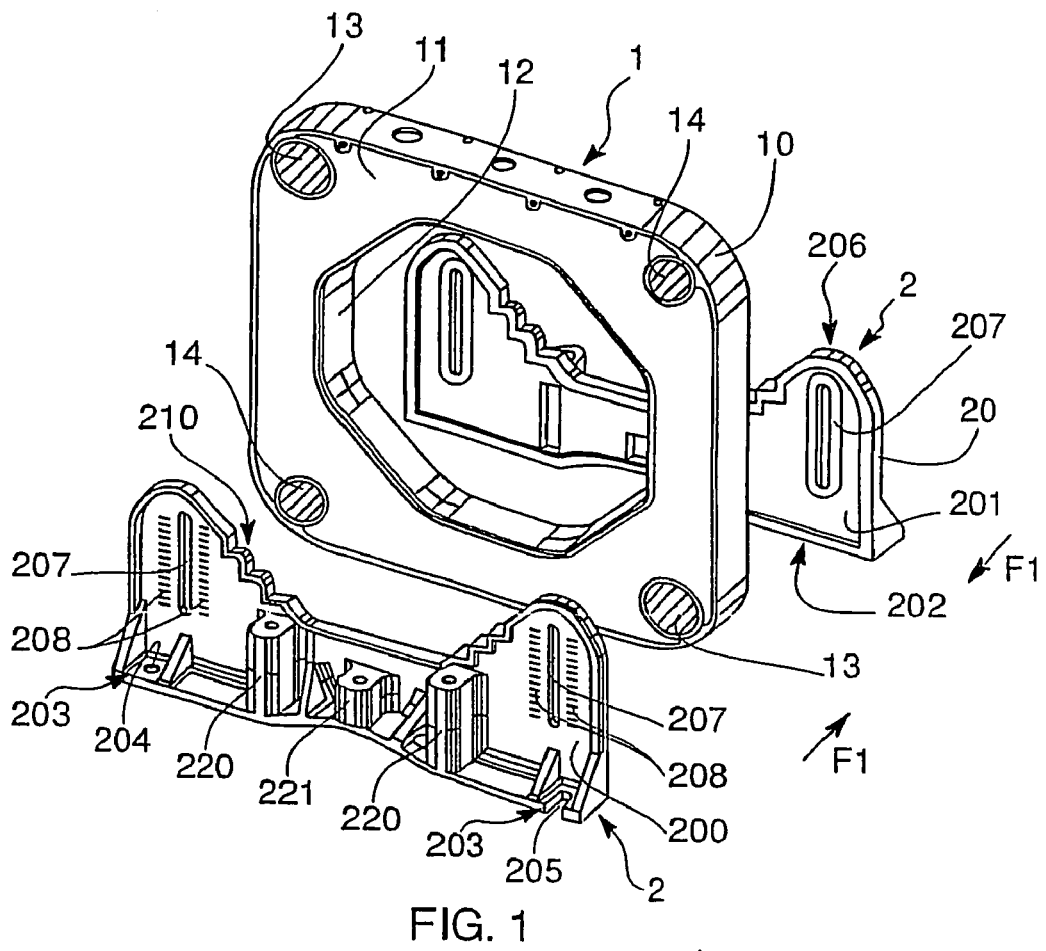

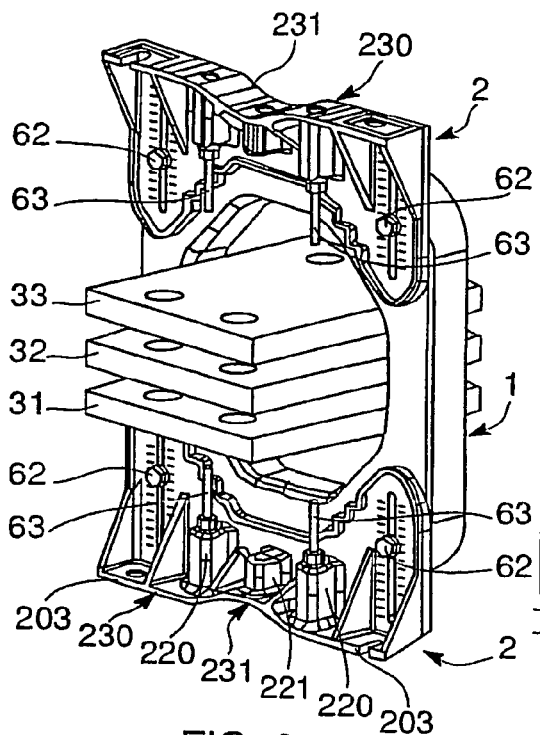
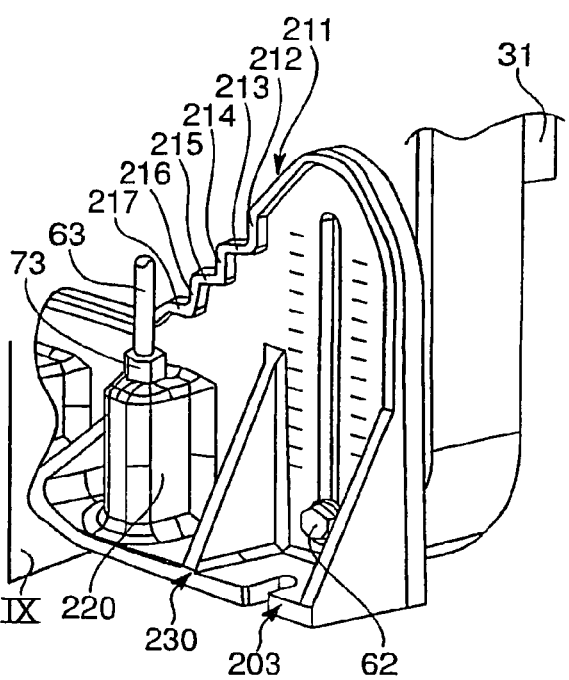
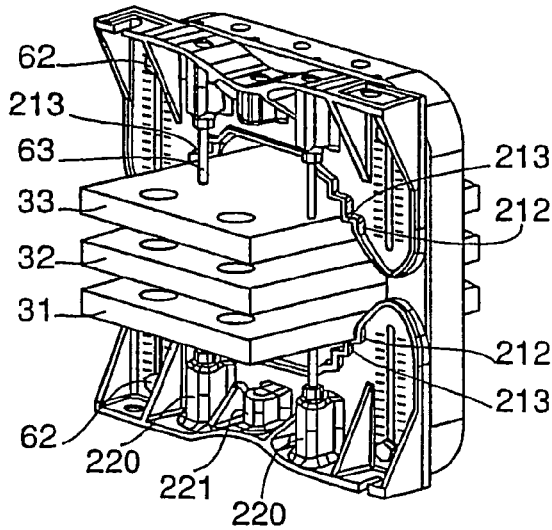
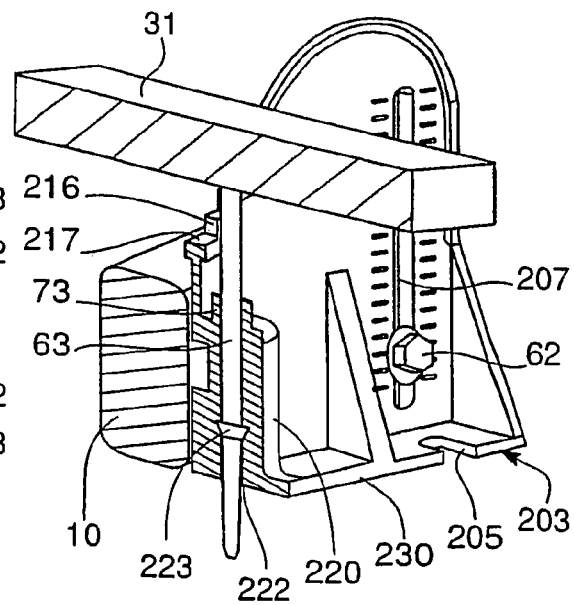
FIG. 6
FIG. 8
FIG. 7
FIG. 9

AUXILIARY ELEMENT FOR FIXING A CURRENT SENSOR TO AN ELECTRICAL CONDUCTOR

The present invention relates generally to a current sensing device adapted to measure the value of the current passing through at least one conductor.

In known manner, the current sensors are present in the form of an overall parallelepipedal housing enclosing means for measuring the current, said housing is traversed by an opening with a closed contour usually constituted by a sleeve through which is disposed the conductor through which passes the current to be measured. Said current sensor housing is suitably positioned with its large surfaces perpendicular to the conductor and to be fixed either directly on the conductor, or on a support in an upright position, when the support is parallel to the conductor, or recumbent, when the support is perpendicular to the conductor.

The securement of said conductor in an upright position is usually carried out by connecting at least one auxiliary element on the current sensor housing. In FR 99 06488, said auxiliary elements are constituted by plates having an internal surface adapted to be applied a large surface of the housing of the current sensor, an external surface carrying tongues extending at a right angle outwardly and in which is formed a first pair of passages for first securement screws. Said first securement screws are adapted to ensure the securement of the auxiliary element to a support parallel to the conductor. On opposite sides of a passage opening for the positioning of the conductor, is provided a second pair of passages for the emplacement of second screws ensuring the securement of the auxiliary element to the housing.

Other securement means are used during securement of the current sensor on the conductor through which the current to be measured passes.

As a result, the installer must continuously have at his disposal different securement means for the current sensor when he carries out an installation.

Moreover, the opening passing through the current sensor and adapted for the passage of the conductor is usually dimensioned so as to have a cross-section whose dimensions are near those of the conductor on which the sensor is to be installed. As a result, the sensors having openings of different dimensions are provided to be selected step by step as a function of the dimensions of the conductor through which the current to be measured passes.

These different arrangements usually used necessarily require providing sets of sensors and external securement elements.

The present invention overcomes this drawback by providing an auxiliary element adapted to ensure the different types of mounting of the sensor, on a support or on the conductor, and a current sensor adapted to be mounted on conductors of different sizes.

To this end, the invention proposes an auxiliary securing and positioning element, to be used pairwise to fix and position a current sensor relative to at least one electrical conductor through which a current to be measured passes, said auxiliary element comprising a plate having an internal surface adapted to be applied against a large surface of the sensor and an external surface which carries, on a first edge, two spaced securement tongues which extend at a right angle outwardly relative to said external surface and in which is formed a first pair of passages for first screws permitting the securement of the auxiliary element on the support, said plate comprising an opening which is a passage for the electrical conductor and, symmetrically on opposite sides of said opening, a second pair of passages for second screws permitting the securement of the plate on the sensor, characterized in that the passage opening for the conductor is constituted by a recess formed in a second edge of the plate opposite the first edge, and the passages of the second pair of passages are constituted by two parallel slots which extend perpendicularly to the first edge of the plate.

The auxiliary element according to the invention is also noteworthy in that:

- the external surface of the plate carries graduations along at least one side of the slots,
- the two securement tongues are connected by a rib running along the first edge of the external surface of the plate and formed in a single piece with the plate, said rib being adapted to come into contact with the conductor in a first assembly mode of the auxiliary element on the large surface of the sensor,
- the rib comprises at its mid-portion a concave portion adapted to come into contact with the portion of the external surface of an electrical cable forming said electrical conductor,
- the recess for the passage of the conductor comprises two edges disposed obliquely in V shape and having a longitudinal profile in the form of stair steps,
- the stair step profiles of the two edges of the recess have pairs of homologous vertical portions, the homologous vertical portions of each pair being spaced a distance corresponding to a normal width of a conductive bar serving as an electrical conductor, and pairs of homologous horizontal portions adapted to come into contact with the surface of said conductive bar in a second mode of assembly of the auxiliary element on the large surface of the sensor,
- the external surface of the plate has a pair of spaced parallel first small columns which extend along the external surface, perpendicular to the first edge of the latter and which each comprise a longitudinal hole for a gripping screw,
- the external surface of the plate has a second central small column which extends along said external surface perpendicular to the first edge of the latter and which comprises a longitudinal hole for a gripping screw.

The invention also relates to an assembly comprised by a current sensor having a housing of parallelepipedal shape with two large surfaces traversed by an opening with a closed contour, dimensioned to permit the passage of at least one electrical inductor having a transverse cross-section having dimensions comprised within a predetermined range, and two auxiliary elements for the securement and positioning of the sensor relative to said conductor, characterized in that each of the two auxiliary elements is an auxiliary element according to the invention.

Figure 2:
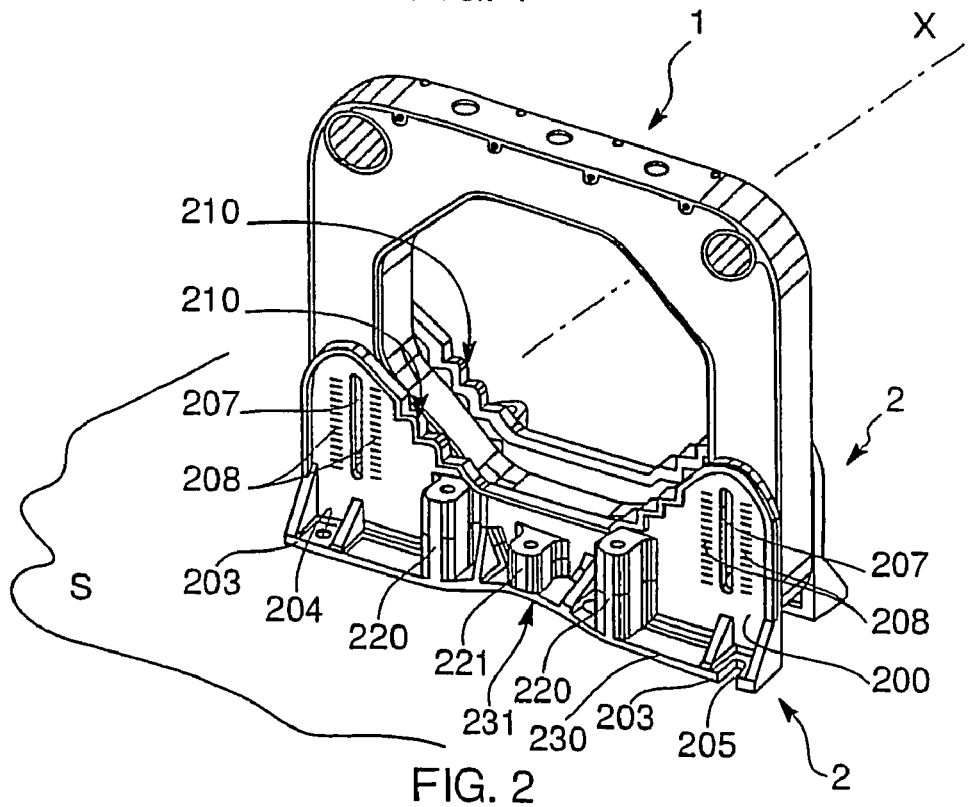
Figure 3:
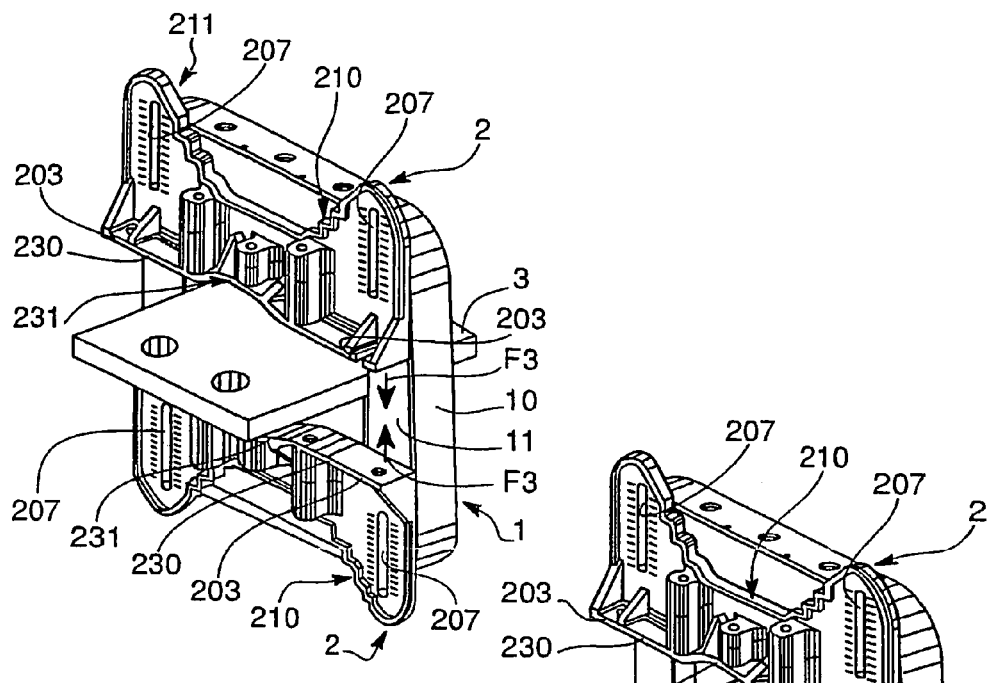
Figure 4:
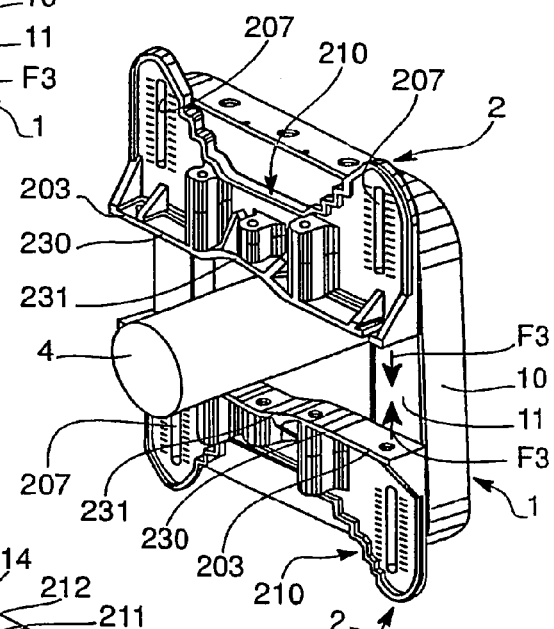
Figure 5:
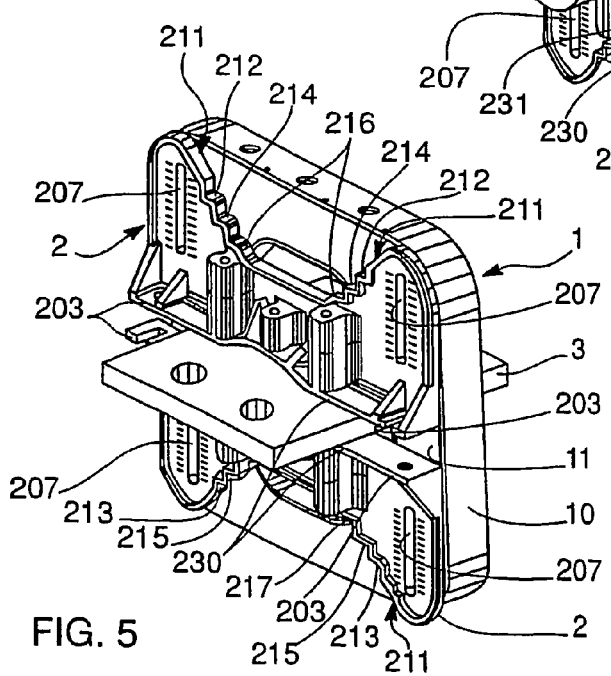

The invention will be better understood from the description which follows, given by way of non-limiting example, with reference to the accompanying drawings, in which:

FIG. 1 is an exploded perspective view of an assembly according to the invention comprised by a current sensor and two auxiliary elements, FIG. 2 is a perspective view of the assembly of FIG. 1 ready to be fixed upright to the conductor on a parallel support, FIGS. 3 and 4 are perspective views showing the assembly according to the invention in the course of assembly on a conductor formed by a bar in FIG. 3 and a cable in FIG. 4, FIG. 5 is a perspective view of the assembly of FIG. 3 ready to be secured on the conductor, FIGS. 6 and 7 are perspective views showing an assembly according to the invention respectively in the course of mounting an assembly of bars and ready to be fixed on the assembly of bars, FIG. 8 is a fragmentary enlarged view of the interior right angle of an assembly shown in FIG. 7, FIG. 9 is a fractional cross-sectional view on the line IX of FIG. 8.

As can be seen in FIG. 1, the invention relates to a current sensing device constituted by an assembly comprising a current sensor 1 and two auxiliary elements 2 for securement and positioning of said sensor 1.

In FIG. 2, the conductor through which the current to be measured passes, is symbolized by its longitudinal axis X.

In a manner known per se, the current sensor 1 is constituted by a generally parallelepipedal housing 10 traversed perpendicular to its large surfaces 11, and usually at the center of these latter, by an opening with a closed contour constituted by a cylindrical sleeve 12. In a non-limiting manner, said sleeve 12 is of hexagonal cross-section in the example of embodiment shown in the drawing.

This sleeve is dimensioned to permit the passage of at least one electrical conductor having a transverse cross-section having dimensions comprised within a predetermined range. This arrangement permits preferably using a single current sensor 1 for mounting about different types of conductors, bars or cables, whether alone or group-wise, and the total size of said conductor or conductors is comprised within the predetermined range.

The housing 10 is traversed in its four corner regions by outlet openings 13, 14 adapted to the passage of securement screws (not shown in the drawing). The emplacement of securement screws in said openings 13, 14 permits the securement of the current sensor in a lowered position on a support perpendicular to the conductor and parallel to the large surfaces 11 of the housing 10.

In the present description, the term "securement screw" is used to refer generally to a securement means such as a bolt (assembly of screw and nut), a screw of the conventional type or self-tapping type. In the case in which screws are used, the openings are shaped suitable to permit their gripping.

In the embodiment shown in the drawing, the outlet openings 13, 14 are of oblong section, the openings 13 on the one hand and the openings 14 on the other hand have their major axis aligned. The use of openings of oblong cross-section permits accommodating defects of parallelism in the course of assembly.

In a manner known per se, the auxiliary elements 2 comprise a generally flat plate 20 having an internal surface 201 adapted to be applied against a large surface 11 of the sensor and an external surface 200.

The auxiliary elements are preferably obtained by molding plastic material.

Along a first edge 202, the lower edge in the position shown in FIGS. 1 and 2, the plate 20 has two spaced securement tongues 203. These tongues 203 are disposed at each end of said first edge 202 in the embodiment shown in the drawing. The securement tongues 203 extend at a right angle outwardly relative to the external surface 200 of the plate 20. Said tongues 203 are traversed by a first pair of passages 204, 205; in the embodiment shown in the drawing, the passage 204 has a closed contour, of oblong cross-section, whilst the passage 205 has an open contour, of elongated cross-section, and opens through the free edge of the tongue 203.

This first pair of passages 204, 205 is adapted to prevent the emplacement of first securement screws (not shown in the drawing) so as to ensure the securement in upright position of the sensor on a support S parallel to the conductor.

According to the invention, the two securement tongues 203 are connected by a rib 230 running along the first edge 202 of the plate 20; Said rib 230 comprising at its middle a concave portion 231.

The plates 2 also have in manner known per se an opening adapted for the passage of the conductor or conductors. According to the invention, this opening is a recess 210 provided in the second edge 206 of the plate 2, opposite the first edge 202.

A second pair of passages 207 traverses the plates 2. The second pair of passages 207 is usually positioned symmetrically on opposite sides of the opening 210 and is adapted to the emplacement of second securement screws 62, FIGS. 6 to 9, adapted to ensure the securement of at least one plate 2 to the housing 10 of the current sensor 1.

According to the invention, the passages 207 of the second pair of passages are slots 207 disposed parallel to each other and perpendicular to the first edge 202 of the plate 2.

Graduations 208 are formed along at least one side of each slot 207.

The two edges 211 of the recess 210 are disposed obliquely in a V shape.

Said oblique edges 211 have a profile in the form of a staircase constituted by pairs of homologous vertical portions and pairs of homologous horizontal portions, three pairs in the embodiment shown in the drawing, respectively 212, 214, 216, and 213, 215, 217.

As will be described in greater detail later, said staircase profile is adapted to ensure the support of the auxiliary elements 2 against conductors comprised by conductive bars. Such conductive bars are usually of a straight cross-section of rectangular shape and of standardized dimensions.

In the auxiliary elements 2 according to the invention, the two vertical portions 212, 214 and 216 of each pair of homologous vertical portions are spaced a distance corresponding to a standard width of conductive bar; the pair of vertical portions 212 corresponding to a greater width than the pair of vertical portions 214, which itself corresponds to a greater width than the pair of vertical portions 216.

Along its external surface 200, the plate 20 of each auxiliary element 2 has a pair of small columns 220 disposed perpendicularly to the rib 230 extending along the first edge 202. The small columns 220 are parallel to each other and spaced along said edge 202. They are located on opposite sides of the concave portion 231 of the rib 230.

A second central small column 221 is disposed between said first small columns 220, at the center of the concave portion 231. This central small column 221 is also perpendicular to the first edge 202 of the auxiliary element 2.

The three small columns 220, 221 have a same configuration, particularly visible as to the first small columns 220 in FIG. 9. Said small columns are traversed by a longitudinal hole 222 and a nut 223 is embedded in the plastic material constituting the auxiliary element 2 during its fabrication. The nut 223 is disposed axially in said hole 222. As a modification, said longitudinal hole 222 could be tapped and have no nut 223.

Screw-threaded rods or screws, shown at 63, for the first small column 220 and not shown for the central column 221, are inserted in the hole 222 by being screwed into the nut 223. These screw-threaded rods 63 carry a positioning nut 73.

As can be seen in FIGS. 1 and 2, during securement of the sensor 1 in upright position on a support S parallel to the conductor, two plates 20, positioned on opposite sides of the housing 10 of said sensor 1 with their internal surface 201 turned toward the large surface 11 of the sensor, are brought together in the direction of the arrows F1, so as to bear against the housing 10 of said sensor 1. The second securement screws, not shown, are positioned through respectively a passage 207 of the second pair of passages of the first plate 20, of an outlet opening 13 or 14 of the housing 10 and of a passage 207 of the second plate 20. These second securement screws ensure the securement of the plates 20 of the two auxiliary elements 2 to the housing 10 of the sensor 1.

The securement of the sensor 1 in upright position is terminated by the emplacement of first screws (not shown in the drawing) in each passage 204, 205 of the first pair of passages formed in the securement tongues 203.

The slots 207 permit relative movement of each plate 2 relative to the housing 10 of the sensor 1. The adjustment of the relative position of the housing 10 relative to the auxiliary elements 2 is ensured by positioning the second securement screws facing an equivalent mark on the graduations 208 formed along at least one side of each slot 207.

FIGS. 3 to 5 show the securement of the current sensor 1 on the conductor through which the current to be measured passes, a conductive bar 3 in FIGS. 3 and 5, a conductive cable 4 in FIG. 4.

In this first assembly manner, two auxiliary elements 2 according to the invention are disposed against the same large surface 11 of the housing 10 with their first edges 202 directed toward the conductor 3 or 4 disposed in the sleeve 12 of the sensor 1.

Second securement screws are disposed through the second passages 207 of said auxiliary elements 2 and the outlet openings 13 or 14 of the housing 10 without being clamped. The auxiliary elements 2 are pushed toward each other in the direction of the arrows F3 until the first edge 202 of each auxiliary element 2 is in contact with the conductor.

When the conductor is a bar 3, the ribs 230 of the auxiliary elements 2 bear against two opposite surfaces of said bar.

When the conductor is a cable 4, the concave portions 231 of the auxiliary elements 2 bear against said cable at diametrically opposed points.

The device according to the invention permits, thanks to the configuration of the slots of the second passages 207 of the auxiliary elements 2, adjusting the relative position of said auxiliary elements 2 relative to the housing 10 of the sensor 1. It is thus possible, when necessary, to position said housing 10 such that the conductor 3, 4 will not be centered relative to the sleeve 12.

When the auxiliary elements 2 bear against the conductor 3, 4, first screws (not shown in the drawing) are inserted in the first passages 204, 205 facing the securement tongues 203 to grip said conductor and to block the position of the sensor 1 relative to said conductor.

When the conductor 3, 4 is suitably disposed relative to the housing 10, the second securement screws are tightened so as to secure together said auxiliary elements 2 and the housing 10.

FIGS. 6 to 9 show a second embodiment of the auxiliary elements 2 on the housing 10 of the sensor 1.

This second manner of assembly is used when the current sensor 1 must be positioned relative to an assembly of several conductive bars 31, 32 and 33 mounted parallel to each other. In a manner known per se, such conductive bars are held spaced from each other by independent means not shown in the drawing.

For this second manner of assembly, the two auxiliary elements 2 are positioned against the same large surface 11 of the housing 10 with recess 10 turned toward the conductors.

Said auxiliary elements 2 are brought together until for each of them, one of the pairs of homologous horizontal portions 213, 215 or 217 will be bearing against an external surface of the conductor 31 or 33 which faces it.

In the embodiment shown in the drawing, the conductive bars 31, 32 and 33 are of standard width corresponding to the difference separating the two portions of the pair of vertical portions 212 of the recess 210. The auxiliary elements 2 are thus brought together until their pairs of respective horizontal portions 213 engage against the external surfaces of the external conductors 31 and 33.

The second securement screws 32 pass through second passages in the form of slots 207 of the auxiliary elements 2 and the through openings 13, 14 of the housing 10 are gripped when the relative position of the housing 10 relative to the conductors 31, 32 and 33 is sought for assembly in the course of performing the method, is obtained.

The screw-threaded rods or screws 63 disposed in the pair of first small columns 220 are screwed into the nut 223 until their ends are in bearing contact against the external surfaces of the external conductors 31 and 33 so as to fix the housing 10 in position relative to said conductors.

The screwing means for the screw-threaded rods 63 are not shown in the drawing, and it is for example possible to use a screwdriver positioned in a groove formed in an end of said screw-threaded rods extending outside the first edge 202 of the auxiliary elements 2.

To terminate the assembly, the positioning nuts 73 are brought against the ends of the small column 220 which face the conductors.

The screw-threaded rods on the second central small columns 221, are used in assemblies of the housing 10 of the detector 1 on a cable so as to bear diametrically against this latter.

As will have been understood from a reading of the above description, the auxiliary elements 2 according to the invention permit providing a type of mounting of the current detector 1 on one or several conductors, which will be bars or cables, centered or not.

The use of the recess 210 permits better adapting the passage opening for the conductors, to the size of these latter.

The invention claimed is:

1. Auxiliary element (2) for securement and positioning, to be used pairwise to fix and position a current sensor (1) relative to at least one electrical conductor (3, 4, 31, 32, 33) through which flows a current to be measured, said auxiliary element (2) comprising a plate (20) having an internal surface (201) adapted to be applied against a large surface (11) of the sensor (1) and an external surface (200) which carries, along a first edge (202), two spaced securement tongues (203) which extend outwardly at a right angle relative to said external surface (200) and in which is formed a first pair of passages (204, 205) for first screws permitting the securement of the auxiliary element (2) on a support (S), said plate (20) comprising a passage opening (210) for the electrical conductor and, symmetrically on opposite sides of said opening (210), a second pair of passages (207) for second screws (62) permitting the securement of the plate (20) to the sensor (1), wherein the passage opening (210) for the conductor is constituted by a recess (210) formed in a second edge (206) of the plate (20) opposite the first edge (202), and passages of the second pair of passages (207) are constituted by two parallel slots which extend perpendicularly to the first edge (202) of the plate (20).

2. Auxiliary element according to claim 1, wherein the external surface (200) of the plate (20) carries graduations (208) along at least one side of the slots (207).

3. Auxiliary element according to claim 2, wherein the two securement tongues (203) are connected to each other by a rib (230) running along the first edge (202) of the external surface (200) of the plate (20) and formed in a single piece with the plate (20), said rib (230) being adapted to come into contact with the conductor (3) in a first assembly mode of the auxiliary element (2) on the large surface (11) of the sensor (1).

4. Auxiliary element according to claim 3, wherein the rib (230) comprises at its middle a concave portion (231) adapted to come into contact with a portion of the external surface of an electrical cable (4) forming said electrical conductor.

5. Auxiliary element according to claim 1, wherein the two securement tongues (203) are connected to each other by a rib (230) running along the first edge (202) of the external surface (200) of the plate (20) and formed in a single piece with the plate (20), said rib (230) being adapted to come into contact with the conductor (3) in a first assembly mode of the auxiliary element (2) on the large surface (11) of the sensor (1).

6. Auxiliary element according to claim 5, wherein the rib (230) comprises at its middle a concave portion (231) adapted to come into contact with a portion of the external surface of an electrical cable (4) forming said electrical conductor.

7. Auxiliary element according to claim 1, wherein the recess (210) for the passage of the conductor comprises two edges (211) disposed obliquely in V arrangement and having a longitudinal profile in the form of a staircase.

8. Auxiliary element according to claim 7, wherein the staircase profile of the two edges (211) of the recess (210) has pairs of homologous vertical portions (212, 214, 216), the homologous vertical portions of each pair being spaced a distance corresponding to a normalized width of a conductive bar (31, 32, 33) serving as an electrical conductor and pairs of homologous horizontal portions (213, 215, 217) adapted to come into contact with a surface of said conductive bar (31, 32, 33) in a second mounting mode of the auxiliary element (2) on the large surface (11) of the sensor (1).

9. Auxiliary element according to claim 1, wherein the external surface (200) of the plate (2) carries a pair of spaced parallel columns (220) which extend along the external surface (200) perpendicular to the first edge (202) of this latter and which each comprise a longitudinal hole (222) for a gripping screw (63).

10. Auxiliary element according to claim 1, wherein the external surface (200) of the plate (20) bears a second central small column (221), which extends along the external surface (200) perpendicular to the first edge (202) of this latter and which comprises a longitudinal hole (222) for a gripping screw.

11. Assembly comprised by a current sensor (1) having a housing (10) of parallelepipedal shape with two large surfaces (11) traversed by an opening (12) of closed contour, dimensioned to permit the passage of at least one electrical conductor having a transverse cross-section having dimensions comprised within a predetermined range, and two auxiliary elements (2) for the securement and positioning of the sensor (1) relative to said conductor, wherein each of the two auxiliary elements is an auxiliary element (2) according to claim 1.

* * * * *

UNITED STATES PATENT AND TRADEMARK OFFICE
CERTIFICATE OF CORRECTION

PATENT NO.        : 7,649,348 B2                                   Page 1 of 1
APPLICATION NO. : 10/580913
DATED             : January 19, 2010
INVENTOR(S)       : Armando Vilas Boas It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 873 days.

Signed and Sealed this

Twenty-eighth Day of December, 2010

David J. Kappos
*Director of the United States Patent and Trademark Office*